United States Patent [19]

Kuriya et al.

[11] Patent Number: 5,449,480
[45] Date of Patent: Sep. 12, 1995

[54] METHOD OF PRODUCING BOARDS FOR PRINTED WIRING

[75] Inventors: Hiroyuki Kuriya; Shinsuke Hagiwara, both of Shimodate, Japan

[73] Assignee: Hitachi Chemical Company, Ltd., Tokyo, Japan

[21] Appl. No.: 45,786

[22] Filed: Apr. 14, 1993

[30] Foreign Application Priority Data

| Apr. 14, 1992 | [JP] | Japan | 4-094349 |
| Apr. 24, 1992 | [JP] | Japan | 4-105050 |
| Apr. 24, 1992 | [JP] | Japan | 4-105051 |

[51] Int. Cl.⁶ .............................................. B29C 45/14
[52] U.S. Cl. ................................... 264/112; 264/261; 264/271.1; 264/272.17; 264/328.18
[58] Field of Search ............... 264/112, 261, 272.17, 264/271.1, 328.18

[56] References Cited

U.S. PATENT DOCUMENTS

| 3,849,187 | 11/1974 | Fetscher et al. | 264/272.17 |
| 3,870,776 | 3/1975 | McMahon | 264/61 |
| 3,943,217 | 3/1976 | Rother | 264/61 |
| 3,998,573 | 12/1976 | Gilbert et al. | 264/112 |
| 4,153,490 | 5/1979 | Werz et al. | 264/112 |
| 4,468,508 | 8/1984 | Ito et al. | 264/331.22 |
| 4,764,327 | 8/1988 | Nozaki et al. | 264/225 |
| 4,772,496 | 9/1988 | Maeda et al. | 264/325 |
| 4,795,660 | 1/1989 | Cooray et al. | 427/123 |
| 4,923,908 | 5/1990 | Lostumo et al. | 427/386 |
| 5,041,254 | 8/1991 | Gallo | 264/272.17 |
| 5,091,135 | 2/1992 | Okada et al. | 264/328.18 |
| 5,158,735 | 10/1992 | Proctor | 264/328.18 |

FOREIGN PATENT DOCUMENTS 0438290 7/1991 European Pat. Off. ............ 264/61

*Primary Examiner*—Allan R. Kuhns
*Attorney, Agent, or Firm*—Antonelli, Terry, Stout & Kraus

[57] ABSTRACT

A method of producing a board for printed wiring comprising disposing a metal foil in a plate-shape cavity of a mold so that the metal foil is in contact with at least one internal side of the cavity, injecting a molding material comprising an epoxy resin, a hardening agent and a powdery inorganic filler into the cavity and curing the epoxy resin, the molding material containing 50 to 90% by volume of the powdery inorganic filler based on the total of the molding material.

20 Claims, 3 Drawing Sheets

METHOD OF PRODUCING BOARDS FOR PRINTED WIRING

BACKGROUND OF THE INVENTION (a) Field of the Invention

The present invention relates to the method of producing boards for printed wiring which are used for the production of electrical and electronic equipment.

(b) Description of the Related Art

Boards for printed wiring to be used for the production of electrical and electronic equipment have been produced by heating and pressing by a press several prepregs comprising base materials, such as paper or glass cloth, impregnated with phenolic resins or epoxy resins, together with metal foil, which is to be a circuit conductor.

The properties of such boards are dominated substantially by the base materials which are present within the boards in a large ratio of 20 to 50% by volume, and it has been difficult to endow the boards with specific characteristics, such as a low thermal expansion, a high thermal conductivity or a high dielectric constant.

Another known method uses molding materials for the production of the boards, but when thermoplastic resins are used as the molding materials, there arise some problems, such as poor soldering thermal resistance, the use of costly thermal resistance resins and warp or deformation. Further, thermoplastic resins generally have high melt viscosities, which arrest the addition of a large amount of fillers for improving the properties of the boards remarkably. In Japanese Patent Application Kokai Koho (Laid-open) Nos. 53-50469 and 58-77276 are disclosed the use of thermosetting resins. However, in the method disclosed therein, conductor layers are provided by plating or bonding after the molding of boards, and it is somewhat doubtful whether the conductor layers have sufficient adhesion strength and electric properties. The integral molding of conductor foils and molding materials are disclosed, for example, in Japanese Patent Application Kokai Koho (Laid-open) No. 62-77926. However, there is no disclosure of the composition of the molding materials used, and inorganic fillers are used in working examples in such a small quantity of about 20% by volume that the boards may have a high coefficient of expansion, thereby deteriorating the adhesion and dimensional stability of the conductor layers (accuracy of circuits).

In Japanese Patent Application Kokai Koho (Laid-open) Nos. 55-57212, 61-136281 and 3-221448 are disclosed the methods for producing boards having high dielectric constant by incorporating high dielectrics into insulating layers. The insulating layers, however, also contain base materials, such as glass cloth, which disable incorporation of the high dielectrics in a large amount sufficient for varying the dielectric constant remarkably.

As described above, the conventional boards containing base materials, such as paper or glass cloth, are difficult to remarkably vary their properties, such as thermal expansion coefficient, thermal conductivity or dielectric constant. Molded boards containing no base materials also involve problems in thermal resistance, cost or reliability.

SUMMARY OF THE INVENTION

The present invention has been made in consideration of the above-described circumstances, and the object of the present invention is to provide an inexpensive method of producing boards for printed wiring which exhibit low thermal expansion, high thermal conductivity or high dielectric constant and are as well excellent in thermal resistance and reliability.

The inventors found that the object of the present invention could be attained by disposing metal foil in a mold, wherein the metal foil is integrally molded together with thermosetting molding materials containing a large amount of powdery inorganic fillers which can impart low thermal expansion, high thermal conductivity or high dielectric constant.

That is, the present invention provides a method of producing a board for printed wiring comprising disposing a metal foil in a plate-shape cavity of a mold so that the metal foil is in contact with at least one internal side of the cavity, injecting a molding material comprising an epoxy resin, a hardening agent and a powdery inorganic filler into the cavity and curing the epoxy resin, the molding material containing 50 to 90% by volume of the powdery inorganic filler based on the total of the molding material, and the powdery inorganic filler being selected from the group consisting of a silica powder, a cordierite powder, an alumina powder, an aluminum nitride powder, a silicon nitride powder, a boron nitride powder, a silicon carbide powder, a boron carbide powder, a beryllia powder, a titanium dioxide powder, a barium titanate powder, a calcium titanate powder, a strontium titanate powder, a lead titanate powder, a barium zirconate-powder, a calcium zirconate powder, a barium stannate powder, a calcium stannate powder, a burned powder of a material of a ceramic capacitor, the burned powder having a dielectric constant of at least 300, and a mixture thereof.

DESCRIPTION OF THE PREFERRED EMBODIMENTS

Figure 1:
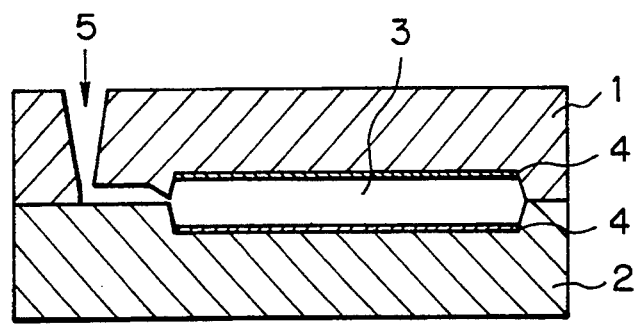
FIG. 1 is a sectional view of a mold illustrating an embodiment according to the present invention wherein two sheets of metal foil are disposed in the cavity of the mold.

The molding material, which is to be the insulating layer of the product board, is a thermosetting molding material which comprises an epoxy resin, a hardening agent and a powdery inorganic filler and contains the powdery inorganic filler in a ratio of 50 to 90% by volume based on the total of the molding material.

The epoxy resin and the hardening agent, which may sometimes be called "resin component" hereinafter, are not particularly limited and may be any ones commonly used as the insulating resins and hardening agents for electrical and electric instruments. Some examples of the epoxy resin include ortho-cresol novolak epoxy resins, diglycidyl ethers of alkyl-substituted biphenols and diglycidyl ethers of bisphenol A resins.

A typical example of the diglycidyl ethers of alkyl-substituted biphenols has the following formula:

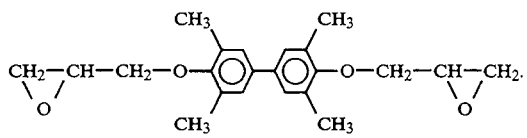

Other examples include those wherein the benzene rings are substituted by lower alkyl groups, such as methyl, ethyl and butyl.

Some examples of the hardening agent include novolak phenolic resins, phenol-aralkyl resins and dicyanodiamide hardening agents.

From the view point of electric properties, moisture resistance and thermal resistance, preferred examples of the combination of the epoxy resin and the hardening agent include a combination of an ortho-cresol novolak epoxy resin and a novolak phenolic resin hardening agents, a combination of a diglycidyl ether of an alkyl-substituted biphenol and a phenol-aralkyl resin hardening agent, a combination of a diglycidyl ether of bisphenol A resin and a dicyandiamide hardening agent, a combination of a diglycidyl ether of an alkyl-substituted biphenol and a novolak phenolic resin and a combination of an ortho-cresol novolak epoxy resin and a phenol-aralkyl resin.

The epoxy resin preferably has a melt viscosity of not more than 3 poise, as measured with an I.C.I. corn and plate viscometer at 150° C. An increased amount of powdery inorganic fillers may decrease the flowability of the molding material at the time of molding, thereby disabling molding materials for molding. Such epoxy resins having low viscosity enable the addition of a sufficient amount of the powdery inorganic fillers, while ensuring the flowability at the time of molding. If the viscosity as measured under the above-described conditions is higher than 3 poise, it may become impossible to blend a sufficient amount of powdery inorganic fillers. Such epoxy resins having low melt viscosity do not require additives for lowering the viscosity of resins, such as organic solvents, plasticizers or diluents. In particular, organic solvents require costly ancillary facilities, such as explosion-proofed apparatuses for drying, recovery apparatuses and exhaust treatment apparatuses, while the epoxy resins having low viscosity do not require such apparatuses.

The powdery inorganic filler is added to the resin component to endow the board with specific properties. The properties endowed by the powdery inorganic filler depend on the kind of the powdery inorganic filler used. The use of a silica powder or a cordierite powder as the powdery inorganic filler provides a board having low thermal expansion. Decreasing the thermal expansion of the insulating layer can coordinate the thermal expansion of the insulating layer with those of the metal foil and of metal plates or the like which may be interposed in the board, thereby preventing troubles, such as warp, peeling or crack. The thermal expansion may be lowered close to that of semiconductor devices to improve the electrical reliability of the circuitry made by the direct mounting of the semiconductor devices on the board.

The use of at least one of an alumina powder, an aluminum nitride powder, a silicon nitride powder, a boron nitride powder, a silicon carbide powder, a boron carbide powder and a beryllia powder as the powdery inorganic filler provides boards having a high thermal conductivity. The boards having high thermal conductivity can release heat by themselves. When radiators are used in combination, the heat generated by electric components can be transferred to the radiators at low resistance.

Boards having high dielectric constant can be obtained by using at least one of a titanium dioxide powder, a barium titanate powder, a calcium titanate powder, a strontium titanate powder, a lead titanate powder, a barium zirconate powder, a calcium zirconate powder, a barium stannate powder and a calcium stannate powder as the powdery inorganic filler. Boards having a higher dielectric constant can be obtained by using, as the powdery inorganic filler, a powder which is prepared by burning and grinding the raw materials of ceramic capacitors and has a dielectric constant of at least 300. Boards having high-dielectric constant themselves function as by-pass capacitors, which remove the high frequency noise mixed in the power lines of digital circuits. Further, such boards enable the down-sizing of high frequency circuits because the width of the circuit pattern for impedance matching can be reduced. Typical examples of the raw materials of ceramic capacitors contain barium titanate as a main component and lesser amounts of various additives.

The content of the powdery inorganic filler in the molding material is 50 to 90% by volume, preferably 60 to 85% by volume. If the content of the powdery inorganic filler is less than 50% by volume, the board cannot be endowed sufficiently with the above-described properties, and if it is more than 90% by volume, the lowered flowability of the molding material may disable the molding. The particle size of the powdery inorganic filler is not particularly limited and may be varied depending, for example, on the desired thickness of the board or the flowability of the resin component in the mold. In general, preferred powdery inorganic fillers have an average particle size of 5 to 50 µm, which is the particle size of the molding materials commonly used. The powdery inorganic filler may be of any shape, such as crushed form, spherical form or fibrous form, so far as it appears powdery. Spherical inorganic fillers increase the flowability of the molding material at the time of molding, and inorganic fillers of crushed form or fibrous form increase the mechanical strength of the board.

The molding material may contain amine or phosphorus cure accelerators which accelerate the curing of the epoxy resin and the hardening agent. The molding material may also contain release agents, such as higher fatty acids, metal salts of higher fatty acids, ester wax or polyethylene wax, and colorants, such as carbon black. Further, coupling agents, such as epoxysilanes, aminosilanes, organic titanates or aluminum alcoholate, may be added to the molding material to improve the adhesion properties of the resin component and the powdery inorganic filler.

The molding material may be prepared generally, for example, by mixing predetermined amounts of the raw material mixture sufficiently, for example, by a mixer, followed by kneading, for example, by an extruder, cooling and grinding. When resin components which are in liquid state at room temperature are used, the raw material mixture may be kneaded with a mixing and grinding machine or a kneader.

Although the metal foil, which is to be formed into circuits after the production of the board for printed wiring, is not particularly limited, preferred is copper foil, which has been commonly used for boards for printed wiring, from the view point of easy soldering and low price. The thickness of the metal foil may be varied depending on the use of the board. The metal foil may have been processed previously, for example, may be provided with through holes or be drawn, according to demand. The side of the metal foil that comes into contact with the molding material is preferably toughened or treated, for example, with coupling agents, to improve the adhesion to the molding material.

The molding of the board by using the molding material and the metal foil may be carried out by any common technique, such as transfer molding, injection molding, compression molding or casting. FIG. 1 illustrates the procedure of molding by a transfer molding. A mold comprising an upper mold i and an lower mold 2 forms a plate-shape cavity 3, wherein two sheets of metal foil 4 are disposed so that the metal foil comes into contact with both internal sides of the cavity. After the above-described molding material is injected through a sprue 5 into and cured in the cavity 3, the mold is opened to obtain a board.

Figure 2:
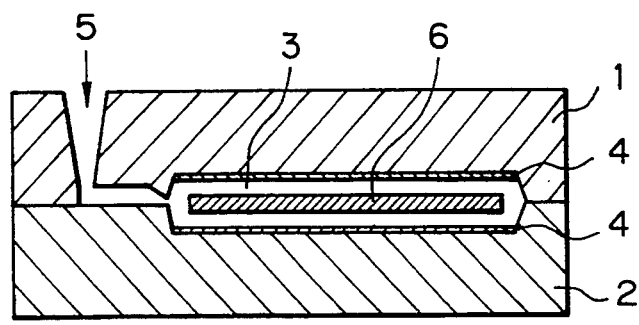
FIG. 2 is a sectional view of a mold illustrating another embodiment according to the present invention wherein two sheets of metal foil and a metal plate are disposed in the cavity of the mold.
Figure 3A:
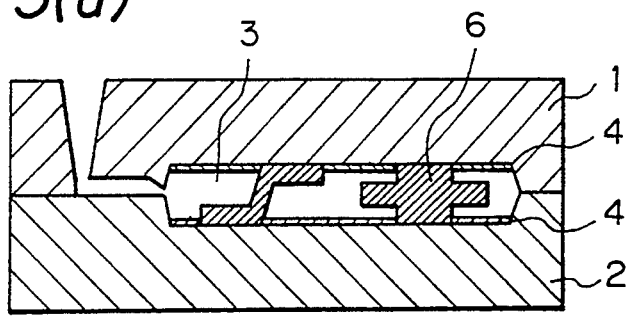
FIGS. 3(a), 3(b), 3(c) and 3(d) are sectional view of molds illustrating more other embodiments according to the present invention wherein metal foil and one or more metal plates are disposed in the cavities of the molds.
Figure 3B:
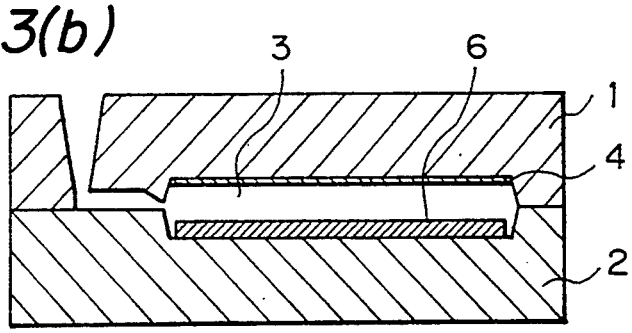
Figure 3C:
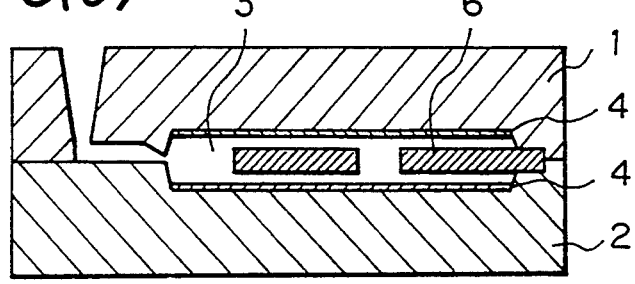
Figure 3D:
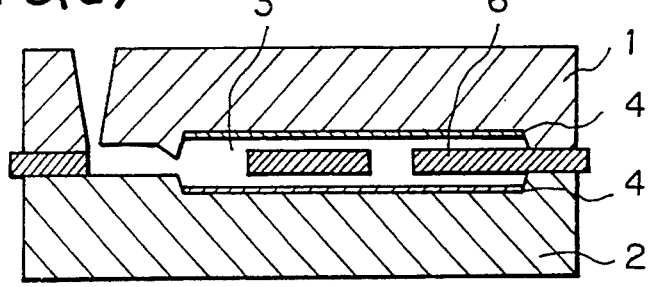

As shown in FIG. 2, at least one metal plate 6 may be disposed in the cavity 3 together with the metal foil 4 so that the metal plate 6 is also molded integrally in the board by the procedure described above. The presence of the metal plate reduces the thermal resistance of the board and increases the efficiency of heat release. The arrangement of the metal plate in the mold may be varied depending on the desired circuit plan, for example, as shown in FIG. 3(a) to (d). As shown in FIG. 3(a), metal plates 6 are partially brought into contact with the internal surface of the cavity 3, so that the metal plates 6 are exposed partially in the surface of the product board. In FIG. 3(b), a metal plate 6 is disposed so that the metal plate 6 is exposed all over a side of the board. As shown in FIG. 3(c), an end of the metal plate may be supported between the upper and lower molds 1 and 2, or, as shown in FIG. 3(d), all outer end of the metal plate 6 may be supported between the upper and lower molds 1 and 2 to use the sandwiched part as a part of the mold or runner.

Although the metal plate may be of any shape, preferred are those having a thermally separated shape, which prevents the heat generated at an area on the board from diffusing through the metal plate to other areas susceptible to temperature rise. Metal plates having an electrically separated shape have different potentials in every separated areas. By using such metal plates as earthing conductors for electrical shield, it is possible to prevent short-circuit among plural circuits which are provided on one board and have different earth potentials, for example, the short-circuit between high voltage circuits and low voltage circuits or between analog circuits and digital circuits.

The material of the metal plate may be of any kind, for example, a metal, such as copper, aluminum or iron, an alloy, such as stainless steel, or those plated with zinc, tin or nickel. Those having high thermal conductivity are desirable for providing the ability of heat release, and those having high conductivity are desirable to use the metal plates as a part of circuits. The thickness of the metal plate is not particularly limited and may be varied depending on the thickness, use or moldability of the board. When two or more metal plates are disposed in a cavity, the relative arrangement of the metal plates is not limited, and all the metal plates may be disposed in the same or different planes in parallel to the cavity, or the metal plates may partially or wholly overlap in the direction of thickness or may form a nest. The surface of the metal plate may be degreased, roughened or treated with coupling agents to improve its adhesion to the molding material.

The metal plate may be provided with through holes larger than the diameter of the through holes for mounting or connection. The through holes clogged with cured resins by the molding can be pierced, for example, by drilling to form through holes insulated from the metal plate by the cured resins. When a circuit requiring two or more through holes close to one other is planed, the two or more through holes may be pierced through one through hole of the metal plate.

Further, the metal plate may also be provided with through holes for passing therethrough the molding material at the time of molding. At the time of molding, the molding material flow through the through holes to prevent the deformation of the metal plate. Further, the resin cured in the through holes improve the adhesion of the metal plate to the cured resin and connect the cured resin layers on each side of the metal plate, thereby improving the resistance to peeling or crack.

It is preferable to cover the metal plate partially or wholly with ceramic coating. The ceramic coating remarkably improve the adhesion of the metal plate and insulating resins. When semiconductor devices are mounted on a metal plate through a ceramic coating, heat release property can be improved while the insulating property is maintained.

The kind of the ceramic coating is not particularly limited so far as the ceramic coating adheres strongly to the metal plate. Preferred are those formed by a ceramic flame-spraying technique, a CVD (Chemical Vapor Deposition) technique or a coating technique using ceramic sol. Those formed by a ceramic flame-spraying technique are particularly preferable since the irregularities or pores in the surface improve remarkably the adhesion to insulating resins. Those formed by a CVD technique preferably have a thickness of 0.5 to 3 $\mu$m. Preferred materials of the ceramic coating are silicon dioxide ceramic and silicon nitride ceramic. The ceramic coating may cover the metal plate partially or wholly. When exposed areas for electrical connection to the metal plate or for soldering or hard soldering are required, the ceramic coating may be formed on the surface of the metal plate, exclusive of the areas, to dispense with removing processes.

Ceramic coatings formed by a ceramic flame-spraying technique preferably have a thickness of 10 to 300 $\mu$m. A thickness less than 10 $\mu$m may be insufficient to prevent the peeling in the interface between the metal plate and the insulating resin. A ceramic coating of more than 300 $\mu$m may cause peeling of the ceramic coating from the metal plate. From the view point of the insulating properties and the operability during the flame-spraying, preferred examples of the materials of the ceramics to be flame-sprayed include alumina ceramic and cordierite ceramic.

When an alumina ceramic or cordierite ceramic coating is formed, for example, by ceramic flame-spraying, it is preferable to subject the part of the metal plate to be covered with the ceramic coating to a nickel surface treatment previously. Preferred examples of the nickel surface treatment include nickel plating and/or nickel flame-spraying to form a nickel base. It is also preferable to flame-spray nickel on a nickel-plated layer formed by nickel plating. A preferred thickness of the nickel base is 5 to 20 µm. The nickel surface treatment increases remarkably the adhesion strength of the ceramic coating to the metal plate. The adhesion strength of metal plates of aluminum or copper to the ceramic coating may also be increased effectively by roughening mechanically the surfaces of the metal plates, for example, by sand blasting, or by roughening chemically, for example, with acids.

Figure 4:
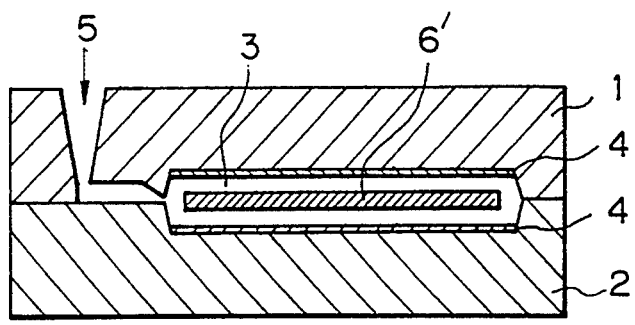
FIG. 4 is a sectional view of a mold illustrating another embodiment according to the present invention wherein two sheets of metal foil and a ceramic plate are disposed in the cavity of the mold.

A board having both heat releasing property and insulating property may be produced by disposing one or more ceramic plates, as shown in FIG. 4, together with the metal foil in a mold and molding them integrally. In FIG. 4, the referential numeral 6' represents a ceramic plate. Since the poor dimensional accuracy of conventional ceramic boards can be solved by the use of the molding material and the mold, it is possible to use ceramic plates of poor dimensional accuracy, which lower the cost of producing the ceramic plates. Further, if the use of an expensive ceramic plate is required, it is not necessary to interpose the ceramic plate fully in a board, and the cost may be decreased by interposing the expensive ceramic plate of a necessary size only in the part requiring the expensive ceramic plate.

The way of disposing the ceramic plate is the same as that for the above-described metal plate. One or more ceramic plates may be used. Some examples of the material of the ceramic plate include alumina ceramic, aluminum nitride ceramic, silicon nitride ceramic, boron nitride ceramic, silicon carbide ceramic, boron carbide ceramic, beryllia ceramic and titania ceramic, and two or more ceramic plates of the same material or different materials may also be used. Preferred are those of high thermal conductivity in order to improve the heat releasing property. The shape of the ceramic plate may be varied according to demand, and two or more ceramic plates of the same shape or different shapes may be used. When two or more ceramic plates are disposed in a board, the relative arrangement of the ceramic plates is not limited, and all the ceramic plates may be disposed in the same or different planes in parallel to the board, or the ceramic plates may partially or wholly overlap in the direction of thickness or may form a nest. The surface of the ceramic plate may be degreased, toughened or treated with coupling agents to improve its adhesion with the insulating resin.

The ceramic plate may be provided with notches or through holes larger than the diameter of the through holes for mounting or connection. The through holes clogged with cured resins by the molding can be pierced, for example, by drilling to form through holes insulated from the metal plate by the cured insulating resins. This dispenses with the very difficult drilling of the ceramic plate itself.

The ceramic plate, as well as the above-described metal plate, may be exposed in the surface of the board to improve the heat releasing efficiency remarkably by mounting thereto directly semiconductor devices or radiators. Further, the ceramic plate may be covered with a metal coating to form an internal circuit by fixing semiconductor devices or other devices thereto by soldering or hard soldering.

The ceramic plate may be disposed in a mold together with the above-described metal plate.

According to the method of the present invention, a multilayer board may be produced by disposing at least one printed wiring board in a mold together with the metal foil and molding them integrally. According to the present invention, a plurality of printed wiring boards of different thicknesses or materials may also be integrally molded into a board.

The way of arranging the one or more printed wiring boards in a mold is the same as the way for the above-described metal plate. The kinds, shapes or number of the printed wiring boards which may be used are not particularly limited, and one or more common printed wiring boards of desired shapes may be used. For example, it is possible to use, individually or in a combination, printed wiring boards which are produced from the boards produced according to the present invention, single-sided, double-sided or multilayer printed wiring boards, flexible printed wiring boards and flex-rigid printed wiring boards. These printed wiring boards may be used in combination of the above-described metal plate and/or the above-described ceramic plate.

Figure 5A:
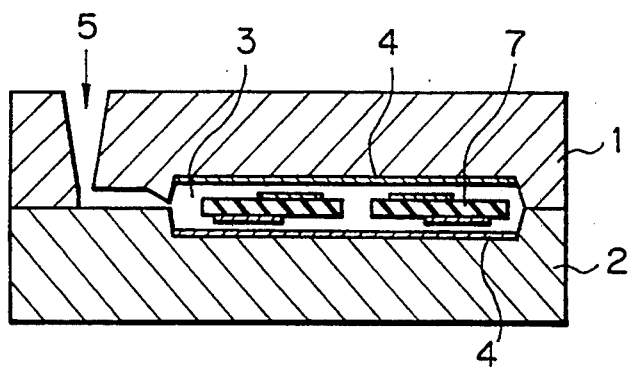
FIG. 5(a) is a sectional view of a mold illustrating another embodiment according to the present invention wherein two sheets of metal foil and two printed circuit boards are disposed in the cavity of the mold.
Figure 5B:
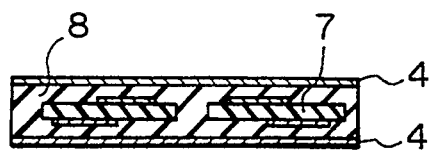
FIG. 5(b) is a sectional view of a board obtained by the embodiment of FIG. 5(a)
Figure 5C:
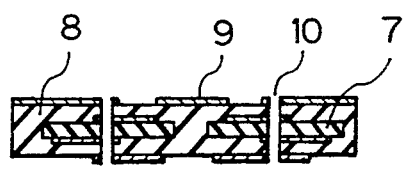
FIG. 5(c) is a sectional view of the board shown in FIG. 5(b) the circuit of which is finished.

FIG. 5(a), (b) and (c) illustrate an embodiment according to the present invention wherein a multilayer printed wiring board is produced. FIG. 5(a) shows the arrangement of metal foil 4 and two printed wiring boards which are disposed in a cavity 3 of a mold comprising an upper mold 1 and a lower mold 2. The referential numeral 5 represents a sprue for injecting a molding material into the cavity 3, wherein the molding material is then cured to form a board for printed wiring the sectional view of which is shown in FIG. 5(b). In FIG. 5(b), the referential numeral 8 represents an insulating layer of the cured molding material. FIG. 5(c) is a sectional view of a multilayer printed wiring board which is produced by making surface circuits 9 from the metal foil 4 by printed wiring and making through holes 10 by drilling.

The method of the present invention, wherein a molding material containing a large amount of fillers which endow with boards low thermal expansion, high thermal conductivity or high dielectric constant is used for molding, enables inexpensive production of boards for printed wiring which are excellent in these properties. Conventional methods could not endow boards with such excellent properties. Further, as compared with thermoplastic molding materials, which have been used in conventional methods employing molding, the thermosetting molding material used in the method of the present invention provides higher adhesion strength between insulating layers and metal foil or internal components, which ensures excellent thermal resistance and reliability.

Examples of the present invention are set forth below. It will be understood that these examples are for purposes of illustration only and are not to be construed as limiting the invention.

EXAMPLES 1 TO 13 AND COMPARATIVE EXAMPLES 1 TO 7

EXAMPLE 1

| | |
|---|---|
| ESCN-195-3: (Trade name, an ortho-cresol novolak epoxy resin produced by Sumitomo Chemical Co., Ltd., epoxy equivalent: 200, softening point: 67° C.) | 100 parts by weight |
| HP-800N: (Trade name, a phenol-novolak resin, produced by Hitachi Chemical Company, Ltd., hydroxyl group equivalent: 106, softening point: 83° C.) | 50 parts by weight |
| fused silica powder: | 1600 parts by weight (85 vol %) |
| epoxy silane coupling agent: | 3 parts by weight |
| triphenylphosphine: | 5 parts by weight |

These raw materials were mixed and then kneaded with two roles of 80° C. for 15 minutes, to obtain a molding material. As shown in FIG. 1, two sheets of single-mat-sided copper foil of 35 μm in thickness were disposed in a mold each of the upper mold and lower mold of which had a cavity of 0.8 mm in depth. The above-described molding material was transferred into the cavity by a transfer press and molded at 175° C. and 7 MPa over a 90 seconds interval, and was then after-cured at 175° C. for 5 hours, to obtain a copper-clad board of 1.6 mm in thickness and 100 mm square.

EXAMPLE 2

A copper-clad board was produced in the same manner as in Example 1 with the exception that 1090 parts by weight 68 vol %) of an alumina powder was used in place of 1600 parts by weight of the fused silica powder used in Example 1.

EXAMPLE 3

A copper-clad board was produced in the same manner as in Example 1 with the exception that 1150 parts by weight (68 vol %) of a titanium dioxide powder was used in place of 1600 parts by weight of the fused silica powder used in Example 1.

EXAMPLE 4

A dielectric powder was prepared by burning N3300-M (Trade name, a material of ceramic capacitors produced by Fuji Titanium Kogyo Kabushiki Kaisha) at 1240° C. for three hours, followed by grinding with a ball mill. The burned product has a dielectric constant of 1100. A copper-clad board was produced in the same manner as in Example 1 with the exception that 1500 parts by weight (68 vol %) of the dielectric powder was used in place of 1600 parts by weight of the fused silica used in Example 1.

EXAMPLE 5

As shown in FIG. 3(d), two sheets of the same copper foil as those used in Example 1 and a copper plate of 1 mm thick provided with several through holes of 2 mm in diameter were disposed in a mold each of the upper mold and lower mold of which had a cavity of 0.3 mm in depth. The same molding material as that used in Example 2 was transferred into the cavity by a transfer press and molded at 175° C. and 7 MPa over a 90 seconds interval, and was then after-cured for 5 hours at 175° C., to obtain a metal-cored copper-clad board of 1.6 mm in thickness and 100 mm square.

EXAMPLE 6

The same copper plate as that used in Example 5 was plated with nickel to a thickness of 2 μm. The nickel-plated copper plate was nickel flame-sprayed to form a nickel flame-sprayed layer of 10 μm in thickness, and was then covered with an alumina ceramic coating of 30 μm in thickness by ceramic flame-spraying. A metal-cored copper-clad board was produced in the same manner as in Example 5 with the exception that the copper plate covered with the alumina ceramic coating was used in place of the copper plate used in Example 5.

EXAMPLE 7

A ceramic-cored copper-clad board was produced in the same manner as in Example 5 with the exception that an alumina ceramic plate of the same shape as that of the copper plate used in Example 5 was used in place of the copper plate.

EXAMPLE 8

A copper-clad board was produced in the same manner as in Example 5 with the exception that a glass-epoxy double-sided printed wiring board of 1 mm thickness having the same shape as that of the metal plate used in Example 5 was used in place of the metal plate. The obtained copper-clad board having four conductor layers was provided with through holes by drilling and plating. Thus obtained multilayer board exhibited good connectability through the through holes between the surface copper foil and the conductor of the printed wiring board included in the board.

COMPARATIVE EXAMPLE 1

A prepreg was prepared by impregnating a glass cloth of 0.2 mm in thickness with a dicyandiamide-hardening epoxy resin varnish, followed by drying. Eight sheets of the same prepreg were laminated, with the same copper foil as that used in Example 1 placed on each side of the laminate. The obtained laminate was formed with heat and pressure at 170° C. and 2 MPa for 90 minutes by using a press, to obtain a copper-clad laminate of 1.6 mm in thickness.

COMPARATIVE EXAMPLE 2

A prepreg was prepared by impregnating a glass cloth of 0.1 mm in thickness with the same epoxy resin varnish as that used in Comparative Example 1. Three sheets of the prepreg and one sheet of the same copper foil as that used in Example 1 were placed on each side of the same copper plate of 1 mm in thickness as that used in Example 5. The obtained laminate was formed in the same manner as in Comparative Example 1, to obtain a metal-cored copper-clad laminate of 1.6 mm in thickness.

COMPARATIVE EXAMPLE 3

A prepreg was prepared by mixing dicyandiamide hardening epoxy resin varnish with 67% by volume of a titanium dioxide powder, based on the solid content of the varnish, by using three rolls, impregnating a glass cloth of 0.2 mm in thickness with the obtained resin varnish, and drying. Eight sheets of the same prepreg were laminated, with the same copper foil as that used in Example 1 placed on each side of the laminate. The obtained laminate was formed with heat and pressure at 170° C. for 90 minutes by using a press, to obtain a copper-clad laminate of 1.6 mm in thickness. The ratios of the resin/glass cloth/titanium dioxide in the board were 45/25/30% by volume.

The coefficients of linear expansion and soldering thermal resistance of the copper-clad boards produced in Example 1 and Comparative Example 1 were evaluated. The measurement of coefficient of linear expansion was carried out in accordance with ASTM D 696 by using a heat mechanical analyzer TMA-8141BS (Trade name, produced by Rigaku Denki Kabushiki Kaisha), to obtain the coefficients of linear expansion at the glass transition temperatures or lower. The measurement of soldering thermal resistance was carried out by exposing test pieces prepared according to JIS C 6481 to moisture for 50 hours in a thermo-hygrostat adjusted to 85° C. and 85% RH, putting the wet test pieces in a solder bath of 300° C. for five minutes, and visually observing the presence of blisters. The results are shown in Table 1.

TABLE 1

|  | Example 1 | Comparative Example 1 |
|---|---|---|
| Coefficient of linear expansion (ppm/°C.) | 6 | 10 (in the direction of the warp) |
|  |  | 20 (in the direction of the weft) |
|  |  | 60 (in the direction of the thickness) |
| Soldering heat resistance | good | bad |

As apparent from the results listed in Table 1, in Example 1, the presence of a large amount of the fused silica powder having low thermal expansion decreased remarkably the coefficient of linear expansion of the board. Further, the coefficient of thermal expansion of the board of Example 1 was isotropic and did not exhibited such a variation depending on the directions in the board as that exhibited by the board of Comparative Example 1. Particularly, in the direction of the thickness, the board of Example 1 had an extremely lower coefficient of thermal expansion of one-tenth as much as that of Comparative Example 1. Such a low coefficient of thermal expansion in the direction of the thickness improves the reliability of plated through holes. The board of Example 1 exhibited good soldering thermal resistance without generating blisters.

The thermal resistance, productivity of through hole, insulating properties of exposed areas and soldering thermal resistance of the copper-clad boards produced in Examples 2, 5, 6 and 7 and Comparative Examples 1 and 2 were evaluated. The measurement of thermal resistance was carried out by removing copper foil from a copper-clad board of 30 mm square, placing the board on an aluminum block, fixing a transistor (2SC2233, produced by Toshiba Corp.) on the board with a heat releasing silicone grease, and calculating the thermal resistance from the power consumed by the transistor and the difference between the temperatures of the upper and lower surfaces of the board. The evaluation of the productivity of through holes was made by drilling a through hole with a drill of 0.9 mm in diameter, forming a plated through hole by electroless copper plating, and observing a section by a microscope. The through holes of the boards of Examples 5, 6 and 7 and Comparative Example 2 were drilled so that the through holes did not come into contact with the core plates interposed in the boards. The evaluation of soldering thermal resistance was conducted in the same manner as described above. The results are shown in Table 2.

TABLE 2

|  | Examples | | | | Comparative examples | |
|---|---|---|---|---|---|---|
|  | 2 | 5 | 6 | 7 | 1 | 2 |
| Thermal resistance (°C./W) | 5 | 2 | 2 | 3 | 20 | 10 |
| The productivity of through hole |  |  |  |  |  |  |
| Filled state | — | good | good | good | — | bad |
| Void | — | good | good | good | — | bad |
| Insulation | — | good | good | good | — | bad |
| Soldering heat resistance | good | good | very good | good | bad | bad |

As apparent from the results shown in Table 2, in Example 2, the presence of a large amount of the alumina powder having high thermal conductivity decreased remarkably the thermal resistance of the board. The boards of Examples 5, 6 and 7, in which metal plates or ceramic plates had been interposed easily, had further decreased thermal resistances. To the contrary, in Comparative Example 2, the through holes of the interposed metal plate could not be filled with the resin, and, therefore, plated through holes for producing circuits could not be formed. All of the boards of Examples exhibited good soldering thermal resistance, and the board of Example 6 covered with the ceramic coating exhibited particularly good soldering thermal resistance.

The dielectric constants of the boards of Examples 3 and 4 and Comparative Examples 1 and 3 were measured. The measurement of dielectric constant was carried out in accordance with JIS C 6481 by using a LCR meter (Model 4274A, produced by Hewlett Packard). The results are shown in Table 3.

TABLE 3

|  | Examples | | Comparative Examples | |
|---|---|---|---|---|
|  | 3 | 4 | 1 | 3 |
| Dielectric constant 1 kHz, 25° C. | 30 | 90 | 5 | 10 |

As apparent from the results shown in Table 3, in Example 3, the presence of a large amount of the filler having high dielectric constant increased the dielectric constant of the board by three times that of the board of Comparative Example 3. The board which was produced in Example 4 by using another filler having a higher dielectric constant had an extremely high dielectric constant, which is increased by nine times that of the board of Comparative Example 3.

EXAMPLES 9 TO 13

The raw materials listed in Table 4 were mixed and then kneaded with two roles of 80° C. for 15 minutes, to obtain a molding material. Two sheets of single-mat-sided copper foil of 35 μm in thickness were disposed in a low pressure transfer mold each of the upper mold and lower mold of which had a cavity of 0.8 mm in depth, so that the shiny surfaces of the copper foil came into contact with the internal upper and lower sides of the cavity. The above-described molding material was transferred into and molded in the cavity between the sheets of the copper foil by a low pressure transfer press at 175° C. and 7 MPa over a 90 seconds interval, and was then after-cured for 5 hours at 175° C., to obtain a copper-clad board of 1.6 mm in thickness and 100 mm square.

TABLE 4

| (note 1) Raw materials | ICI viscosity (150° C.) | Dielectric constant (1 kHz, 25° C.) | Examples | | | | |
|---|---|---|---|---|---|---|---|
| | | | 9 | 10 | 11 | 12 | 13 |
| YX-4000H | 0.1 P | | 100 | | 100 | 100 | 100 |
| ESCN-195-3 | 3 P | | | 100 | | | |
| HP-800N | | | 50 | 50 | | 50 | 50 |
| XL-225-3L | | | | | 80 | | |
| DBU | | | 3 | 1 | 3 | 3 | 3 |
| Titanate dioxide powder | | 100 | 820 | 810 | 985 | | |
| Burned powder of N3300-M | | 1100 | | | | 1080 | 1680 |
| (vol %) | | | (60) | (60) | (60) | (60) | (70) |

(note 1)
YX-4000H: Trade name, a diglycidyl ether of an alkyl-substituted biphenol produced by Yuka Shell Epoxy Co., Ltd. (epoxy equivalent: 188, melting point: 108° C.)

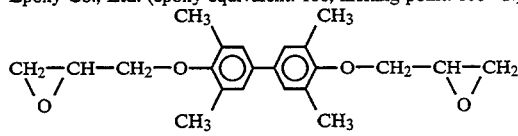

ESCN-195-3: Trade name, an ortho-cresol novolak epoxy resin, produced by Sumitomo Chemical Co., Ltd.
HP-800N: Trade name, a phenol novolak resin (hardening agent), produced by Hitachi Chemical Company, Ltd.
XL-225-3L: Trade name, a phenol-aralkyl resin (hardening agent), produced by Mitsui Toatsu Chemicals, Inc. (hydroxyl group equivalent: 167, softening point: 70° C.)
DBU: 1,8-diazabicyclo-(5,4,0)-undecene-7 (cure accelerator)
Titanium dioxide powder: a titania powder, produced by Showa Denko K.K.
Burned powder of N3300-M: A powder prepared by burning at 1240° C. for three hours a blended powder for ceramic capacitors produced by Fuji Chitan Kogyo Kabushiki Kaisha and grinding the burned product by a ball mill.

COMPARATIVE EXAMPLE 4

A copper-clad laminate was produced in the same manner as in Comparative Example 1 with the exception that 67% by volume of a burned powder of N3300-M, based on the solid content of the varnish, was mixed to the varnish. The ratios of the resin/glass cloth/N3300-M in the board were 45/25/30% by volume.

COMPARATIVE EXAMPLE 5

A copper-clad laminate was produced in the same manner as in Comparative Example 1 with the exception that 114% by volume of the burned powder of N3300-M, based on the solid content of the varnish, was mixed to the varnish. The ratios of the resin/glass cloth/N3300-M in the board were 45/25/30% by volume.

COMPARATIVE EXAMPLE 6

A molding material was prepared by kneading 100 parts by weight of POLYETHERSULFONE RESIN 4100G (Trade name, produced by Sumitomo Chemical Co., Ltd.) and 170 parts by weight of the same burned powder of N3300-M as that used in Comparative Example 2 at 330° C. The same copper foil as used in Example 1 was disposed in an injection mold, wherein the above-described molding material was then injection molded, to obtain a copper-clad board of 1.6 mm in thickness.

By using the copper-clad board thus obtained, evaluations of dielectric constant, the presence of voids in boards, peel strength of copper foil and soldering thermal resistance were carried out. The measurement of dielectric constant was carried out according to JIS C 6481 by using a LCR meter (Model 4274A, produced by Hewlett Packard). The evaluation of the presence of voids in boards was carried out on the board the copper foil of which had been removed off, by using a soft X-ray unit (Pro-Test 100 model, SOFTEX CO., LTD.). The measurement of the peel strength of copper foil was carried out according to JIS C 6481 at room temperature by using the boards kept to the normal state. The evaluation of soldering thermal resistance was carried out according to JIS C 6481 by exposing the boards kept to the normal state to a high temperature of 260° C., and observing the occurrence of blister or peeling 20 seconds after the exposure to the high temperature. The results are shown in Table 5.

TABLE 5

| | Examples | | | | | Comparative Examples | | | |
|---|---|---|---|---|---|---|---|---|---|
| | 9 | 10 | 11 | 12 | 13 | 3 | 4 | 5 | 6 |
| Moldability | ○ | ○ | ○ | ○ | ○ | ○ | ○ | x | ○ |
| Dielectric constant (1 kHz, 25° C.) | 22 | 22 | 22 | 65 | 95 | 10 | 13 | — | 12 |
| Voids | No | No | No | No | No | No | No | Yes | No |
| Peel strength of copper foil (kN/m) | 2.0 | 1.6 | 2.0 | 2.0 | 2.0 | 1.5 | 1.5 | 0.5 | 0.7 |
| Soldering heat resistance | ○ | ○ | ○ | ○ | ○ | ○ | ○ | — | x |

○: good, x : bad

From the comparison between the results of Examples 9 and 12 as shown in Table 5, the filler having a dielectric constant of 11 times that of the other filler increased the dielectric constant of the board by three times. To the contrary, from the comparison between the results of Comparative Examples 3 and 4, the dielectric constant of the board was increased only by 1.3 times in spite of the use of the same dielectric powder. This shows that as the amount of a filler increases, the influence of the dielectric constant of the filler increases, thereby increasing the dielectric constant of boards more effectively. In Example 13, wherein the amount of the filler was further increased, the obtained board had a dielectric constant which was extremely higher than that of the board of Comparative Example 4 by about 7 times. To the contrary, in Comparative Example 5, the increased amount of filler lowered the flowability of the resin, and the resulting resin contained many voids, which disabled the production of a board by molding. All boards of Examples exhibited good peel strength of copper foil, and the boards of Examples 9, 11, 12 and 13, which were produced by using YX-4000H as the epoxy resin, exhibited particularly excellent peel strength. The board of Comparative Example 6, which was produced by using a thermoplastic resin, had a poor soldering thermal resistance and a low peel strength of copper foil.

What is claimed is,

1. A method of producing a metal-clad board for printed wiring comprising disposing a foil of the metal in a plate-shape cavity of a mold so that the metal foil is in contact with at least one internal side of the cavity, disposing at least one metal plate within the cavity and then injecting a molding material comprising an epoxy resin, a hardening agent and a powdery inorganic filler into the cavity and curing the epoxy resin; the molding material containing 50 to 90% by volume of the powdery inorganic filler based on the total of the molding material, and the powdery inorganic filler being selected from the group consisting of a silica powder, a cordierite powder, an alumina powder, an aluminum nitride powder, a silicon nitride powder, a boron nitride powder, a silicon carbide powder, a boron carbide powder, a beryllia powder, a titanium dioxide powder, a barium titanate powder, a calcium titanate powder, a strontium titanate powder, a lead titanate powder, a barium zirconate powder, a calcium zirconate powder, a barium stannate powder, a calcium stannate powder, a burned powder of a material of a ceramic capacitor, the burned powder having a relative dielectric constant of at least 300, and a mixture thereof; said metal foil providing an outer metal layer of the metal-clad board and the at least one metal plate being disposed in the cavity so that at least a portion of the at least one metal plate is embedded within the molding material to provide reduced thermal resistance and increased heat release of the metal-clad board.

2. The method as claimed in claim 1, wherein the epoxy resin has a melt viscosity of not more than 3 poise, as measured at 150° C.

3. The method as claimed in claim 2, wherein the epoxy resin is a diglycidyl ether of an alkyl-substituted biphenol.

4. The method as claimed in claim 1, wherein the hardening agent is a novolak phenolic resin or a phenol-aralkyl resin.

5. The method as claimed in claim 1, wherein the powdery inorganic filler is selected from the group consisting of a silica powder, a cordierite powder and a mixture thereof.

6. The method as claimed in claim 5, wherein the powdery inorganic filler is a silica powder.

7. The method as claimed in claim 1, wherein the powdery inorganic filler is selected from the group consisting of an alumina powder, an aluminum nitride powder, a silicon nitride powder, a boron nitride powder, a silicon carbide powder, a boron carbide powder, a beryllia powder and a mixture thereof.

8. The method as claimed in claim 7, wherein the powdery inorganic filler is an alumina powder.

9. The method as claimed in claim 1, wherein the powdery inorganic filler is selected from the group consisting of a titanium dioxide powder, a barium titanate powder, a calcium titanate powder, a strontium titanate powder, a lead titanate powder, a barium zirconate powder, a calcium zirconate powder, a barium stannate powder, a calcium stannate powder, the burned powder of a material of a ceramic capacitor and a mixture thereof.

10. The method as claimed in claim 9, wherein the powdery inorganic filler is a titanium dioxide powder or the burned powder of a material of ceramic capacitor.

11. The method as claimed in claim 1, wherein the metal plate is a copper plate.

12. The method as claimed in claim 1, wherein the metal plate is partially or wholly covered with a ceramic coating.

13. The method as claimed in claim 12, wherein the ceramic coating is a ceramic flame-sprayed coating of 10 to 300 μm thick.

14. The method as claimed in claim 13, wherein the ceramic flame-sprayed coating is formed by coating the metal plate with nickel and flame-spraying an alumina ceramic or a cordierite ceramic on the nickel coating.

15. The method as claimed in claim 14, wherein the ceramic is an alumina ceramic, and the powdery inorganic filler is an alumina powder.

16. The method as claimed in claim 1, wherein before the injection of the molding material into the cavity, a printed wiring board is further disposed in the cavity.

17. The method as claimed in claim 16, wherein the printed wiring board is a glass-epoxy resin double-sided wiring board and the powdery inorganic filler is an alumina powder.

18. A method of producing a metal-clad board for printed wiring comprising disposing a foil of the metal in a plate-shape cavity of a mold so that the metal foil is in contact with at least one internal side of the cavity, disposing at least one ceramic plate within the cavity and then injecting a molding material comprising an epoxy resin, a hardening agent and a powdery inorganic filler into the cavity and curing the epoxy resin; the molding material containing 50 to 90% by volume of the powdery inorganic filler based on the total of the molding material, and the powdery inorganic filler being selected from the group consisting of a silica powder, a cordierite powder, an alumina powder, an aluminum nitride powder, a silicon nitride powder, a boron nitride powder, a silicon carbide powder, a boron carbide powder, a beryllia powder, a titanium dioxide powder, a barium titanate powder, a calcium titanate powder, a strontium titanate powder, a lead titanate powder, a barium zirconate powder, a calcium zirconate powder, a barium stannate powder, a calcium stannate powder, a burned powder of a material of a ceramic capacitor, the burned powder having a relative dielectric constant of at least 300, and a mixture thereof; said metal foil providing an outer metal layer of the metal-clad board and the at least one ceramic plate being disposed in the cavity so that at least a portion of the at least one ceramic plate is embedded within the molding material to provide reduced thermal resistance and increased heat release of the metal-clad board.

19. The method as claimed in claim 18, wherein the ceramic plate is selected from the group consisting of an alumina ceramic plate, an aluminum nitride ceramic plate, a silicon nitride ceramic plate, a boron nitride ceramic plate, a silicon carbide ceramic plate, a boron carbide ceramic plate and a beryllia ceramic plate.

20. The method as claimed in claim 19, wherein the ceramic plate is an alumina ceramic plate and the powdery inorganic filler is an alumina powder.

* * * * *